(12) United States Patent
Carpenter et al.

(10) Patent No.: US 12,231,109 B2
(45) Date of Patent: Feb. 18, 2025

(54) ELECTRONIC DEVICE WITH SOLDER INTERCONNECT AND MULTIPLE MATERIAL ENCAPSULANT

(71) Applicant: Qorvo US, Inc., Greensboro, NC (US)

(72) Inventors: Charles E. Carpenter, Apopka, FL (US); Howard Terry Glascock, Apopka, FL (US); Paul Stokes, Apopka, FL (US); Thomas Scott Morris, Apopka, FL (US)

(73) Assignee: Qorvo US, Inc., Greensboro, NC (US)

( * ) Notice: Subject to any disclaimer, the term of this patent is extended or adjusted under 35 U.S.C. 154(b) by 429 days.

(21) Appl. No.: 17/350,842

(22) Filed: Jun. 17, 2021

(65) Prior Publication Data

US 2022/0052667 A1 Feb. 17, 2022

Related U.S. Application Data

(60) Provisional application No. 63/065,721, filed on Aug. 14, 2020.

(51) Int. Cl.
*H03H 9/05* (2006.01)
*H03H 3/02* (2006.01)
(Continued)

(52) U.S. Cl.
CPC ............ *H03H 9/0523* (2013.01); *H03H 3/02* (2013.01); *H03H 9/02086* (2013.01);
(Continued)

(58) Field of Classification Search
CPC .... H03H 3/02; H03H 9/02086; H03H 9/0523; H03H 9/08; H03H 9/1007; H03H 9/173; H03H 9/564

See application file for complete search history.

(56) References Cited

U.S. PATENT DOCUMENTS 5,872,493 A * 2/1999 Ella .................. H03H 9/605
333/191
9,520,368 B1 * 12/2016 Tonomura ............... H01L 23/66
(Continued)

FOREIGN PATENT DOCUMENTS

EP             0794616 A2     9/1997
JP           2013198073 A     9/2013
(Continued)

OTHER PUBLICATIONS

International Search Report and Written Opinion for International Patent Application No. PCT/US2021/046067, mailed Dec. 3, 2021, 22 pages.
(Continued)

*Primary Examiner* — Quan Tra
*Assistant Examiner* — Anh-Quan Tra
(74) *Attorney, Agent, or Firm* — Withrow & Terranova, P.L.L.C.

(57) ABSTRACT

The disclosure is directed to an electronic device with a solder interconnect and multiple material encapsulant. The electronic device includes a die last assembly with the die assembled to an electronic packaging substrate by a solder interconnect. At least a portion of a first dielectric material and the die are milled or ground, with a second dielectric material applied over an exposed portion of the die. A shield is then positioned over and electrically insulated from the die. Accordingly, such a configuration reduces a thickness or height of an electronic device with shielding and a die last assembly.

19 Claims, 6 Drawing Sheets

(51) Int. Cl.
  *H03H 9/02*  (2006.01)
  *H03H 9/08*  (2006.01)
  *H03H 9/10*  (2006.01)
  *H03H 9/17*  (2006.01)
  *H03H 9/56*  (2006.01)

(52) U.S. Cl.
  CPC ............ *H03H 9/08* (2013.01); *H03H 9/1007* (2013.01); *H03H 9/173* (2013.01); *H03H 9/564* (2013.01)

(56) References Cited

U.S. PATENT DOCUMENTS

| | | | | |
|---|---|---|---|---|
| 2004/0113215 | A1* | 6/2004 | Shimada | H03H 3/08 |
| | | | | 257/E23.128 |
| 2006/0263912 | A1* | 11/2006 | Arroyo | G01K 7/425 |
| | | | | 374/10 |
| 2007/0182029 | A1* | 8/2007 | Franosch | H01L 21/561 |
| | | | | 257/793 |
| 2014/0042870 | A1 | 2/2014 | Ohashi et al. | |
| 2015/0008789 | A1 | 1/2015 | Iwamoto | |
| 2017/0273183 | A1 | 9/2017 | Kawasaki et al. | |
| 2019/0096699 | A1 | 3/2019 | Chiang et al. | |
| 2019/0237407 | A1 | 8/2019 | Lee et al. | |
| 2020/0105639 | A1* | 4/2020 | Valavala | H01L 23/373 |
| 2020/0219786 | A1* | 7/2020 | Hung | H01L 23/3185 |
| 2021/0344258 | A1* | 11/2021 | Singh | H05K 1/144 |
| 2021/0391235 | A1* | 12/2021 | Qu | H01L 21/54 |
| 2022/0375806 | A1* | 11/2022 | Huang | H01L 23/10 |

FOREIGN PATENT DOCUMENTS

| | | |
|---|---|---|
| WO | 2008078898 A1 | 7/2008 |
| WO | 2020020537 A1 | 1/2020 |

OTHER PUBLICATIONS

Written Opinion for International Patent Application No. PCT/US2021/046067, mailed Apr. 1, 2022, 11 pages.

PCT Notification Concerning Informal Communications with the Applicant for International Patent Application No. PCT/US2021/046067, mailed Jan. 31, 2023, 4 pages.

International Preliminary Report on Patentability for International Patent Application No. PCT/US2021/046067, mailed Feb. 3, 2023, 27 pages.

* cited by examiner

ELECTRONIC DEVICE WITH SOLDER INTERCONNECT AND MULTIPLE MATERIAL ENCAPSULANT

RELATED APPLICATIONS

This application claims the benefit of provisional patent application Ser. No. 63/065,721, filed Aug. 14, 2020, the disclosure of which is hereby incorporated herein by reference in its entirety.

FIELD OF THE DISCLOSURE

The present invention relates to packaging of integrated circuits (ICs). In particular, the present invention relates to an electronic device with solder interconnect and multiple material encapsulant.

BACKGROUND

Mobile devices, such as cellular phones, demand increasingly smaller integrated circuits (ICs), including radio frequency (RF) circuits. Decreasing sizes of electronic devices becomes challenging, particularly with certain types of electronic devices and/or for certain types of manufacturing processes. For example, acoustic resonators, and particularly Bulk Acoustic Wave (BAW) resonators, are used in many high-frequency communication applications. While demands keep raising the complexity of the wireless devices, there is a constant need to improve the performance of BAW resonators and BAW-based filters as well as decrease the cost and size associated therewith.

SUMMARY

Embodiments of the disclosure are directed to an electronic device with a solder interconnect and multiple material encapsulant. The electronic device includes a die last assembly with the die assembled to an electronic packaging substrate by a solder interconnect. At least a portion of a first dielectric material and the die are milled or ground, with a second dielectric material applied over an exposed portion of the die. A shield is then positioned over and electrically insulated from the die. Accordingly, such a configuration reduces a thickness or height of an electronic device with shielding and a die last assembly.

One embodiment of the disclosure relates to an electronic device. The electronic device includes an electronic packaging substrate with conductor trace. The electronic device further includes a first die, including an electronic component, and a solder interconnect electrically coupling the electronic component to the electronic packaging substrate. The electronic further includes an encapsulant surrounding the first die. The encapsulant includes a first dielectric material at a periphery of the electronic component at a first thickness. The encapsulant further includes a second dielectric material at a top of the electronic component at a second thickness less than the first thickness. The electronic device further includes a shield covering the encapsulant.

Another embodiment of the disclosure relates to a method of manufacturing an electronic device. The method includes assembling a first die to an electronic packaging substrate such that solder interconnects of the first die couple an electronic component of the first die with the electronic packaging substrate. The method further includes forming a body portion of an encapsulant around the first die. The body portion includes a first dielectric material. The method further includes removing at least a portion of the encapsulant and the first die to form an exposed portion of the first die. The method further includes applying a film of a second dielectric material to cover the exposed portion of the first die.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description, serve to explain the principles of the disclosure.

DETAILED DESCRIPTION

Figure 1A:
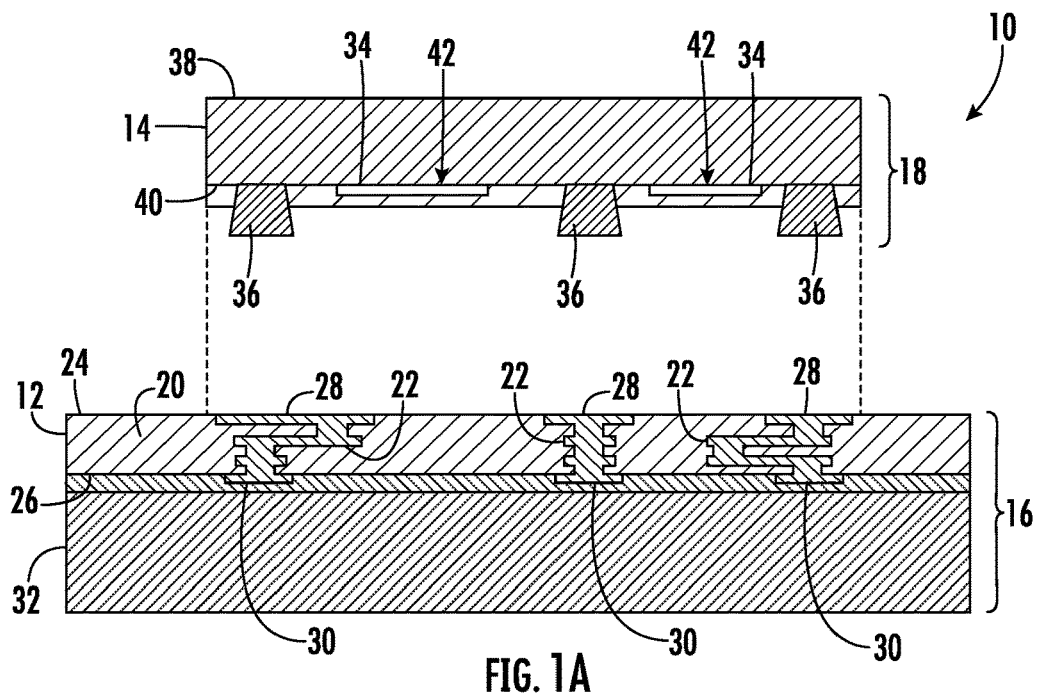
FIG. 1A is a side view of assembly of an electronic device illustrating formation of an electronic packaging substrate and a die.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It should be understood that, although the terms first, second, etc., may be used herein to describe various elements, these elements should not be limited by these terms. These terms are only used to distinguish one element from another. For example, a first element could be termed a second element, and, similarly, a second element could be termed a first element without departing from the scope of the present disclosure. As used herein, the term "and/or" includes any and all combinations of one or more of the associated listed items.

It should also be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present.

It should be understood that, although the terms "upper," "lower," "bottom," "intermediate," "middle," "top," and the like may be used herein to describe various elements, these elements should not be limited by these terms. These terms are only used to distinguish one element from another. For example, a first element could be termed an "upper" element, and, similarly, a second element could be termed an "upper" element depending on the relative orientations of these elements, without departing from the scope of the present disclosure.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having meanings that are consistent with their meanings in the context of this specification and the relevant art and will not be interpreted in an idealized or overly formal sense unless expressly so defined herein.

Embodiments of the disclosure are directed to an electronic device with a solder interconnect and multiple material encapsulant. The electronic device includes a die last assembly with the die assembled to an electronic packaging substrate by a solder interconnect. At least a portion of a first dielectric material and the die are milled or ground, with a second dielectric material applied over an exposed portion of the die. A shield is then positioned over and electrically insulated from the die. Accordingly, such a configuration reduces a thickness or height of an electronic device with shielding and a die last assembly.

FIGS. 1A-1H illustrate assembly of an electronic device 10 (may also be referred to herein as a package, circuit package, stacked assembly, etc.). In certain embodiments, the electronic device 10 is a sub-module (e.g., for a radio frequency (RF) system in package (SiP)). A SiP is a number of integrated circuits enclosed in one or more chip carrier packages that may be stacked (e.g., using package on package).

FIG. 1A is a side view of assembly of an electronic device 10 illustrating formation of an electronic packaging substrate 12 and a die 14. In particular, a substrate subassembly 16 with the electronic packaging substrate 12 and a die subassembly 18 with the die 14.

The electronic packaging substrate 12 includes a body portion 20 (e.g., polyimide) with conductor traces 22 within the body portion 20. The conductor traces 22 extend from a top side 24 of the electronic packaging substrate 12 to a bottom side 26 of the electronic packaging substrate 12 with top conductor pads 28 at the top side 24 and bottom conductor pads 30 at the bottom side 26 of the electronic packaging substrate 12. In certain embodiments, the electronic packaging substrate 12 includes a redistribution layer (RDL) or a laminate. In certain embodiments, the RDL is an extra metal layer on a chip that makes Input/Output (IO) pads of an integrated circuit available in other locations of the chip for better access. The substrate subassembly 16 includes a substrate carrier 32 at the bottom side 26 of the electronic packaging substrate 12.

The die subassembly 18 includes the die 14, which includes an electronic component 34 and conductive pillars 36. In particular, the die 14 includes a top side 38 and a bottom side 40. The electronic component 34 is positioned at a bottom side 40 of the die 14. The die 14 could include Si, GaAs, and/or GaN.

The conductive pillars 36 (e.g., copper pillar (CuP) bumps) extend from a bottom side 40 of the electronic component 34. In certain embodiments, the die 14 includes a Bulk Acoustic Wave (BAW) filter die, and the electronic component 34 includes a BAW filter. In certain embodiments, the BAW filter die includes an air cavity structure 42. In certain embodiments, the BAW filter die is devoid of the air cavity structure 42.

In certain embodiments, the die subassembly 18 is formed on a wafer. Further, conductive pillars 36 are formed on the wafer. Then, the wafer is sliced into individual chips, thereby forming a plurality of dies 14. In other words, the die subassembly 18 is manufactured with a chip last (i.e., RDL first) construction.

Figure 1B:
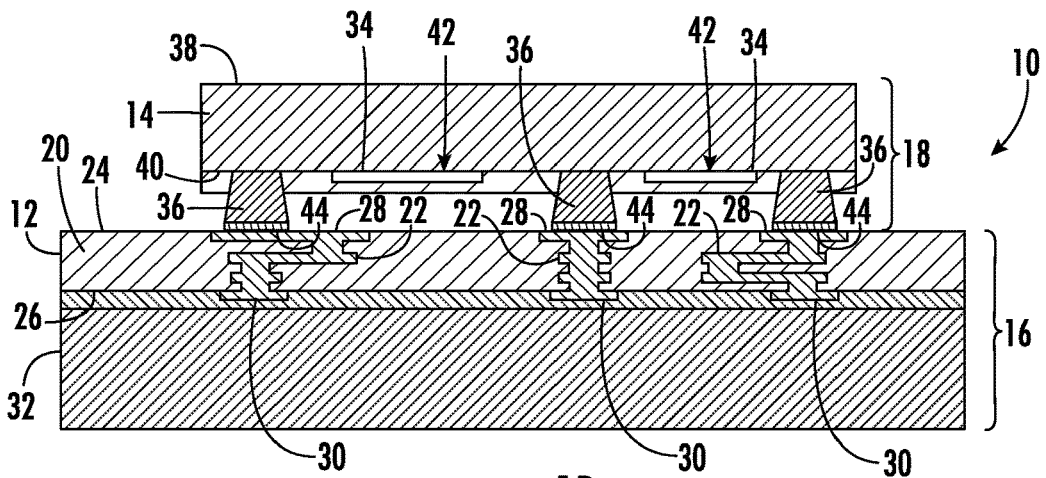
FIG. 1B is a side view of assembly of the electronic device of FIG. 1A, illustrating connecting the electronic packaging substrate and the die by a solder interconnect.

FIG. 1B is a side view of assembly of the electronic device of FIG. 1A, illustrating connecting the electronic packaging substrate 12 and the die 14 by a solder interconnect 44. The solder interconnect 44 is positioned at an end of each of the conductive pillars 36. The solder interconnect 44 electrically couples the electronic component 34 to the electronic packaging substrate 12. In particular, the solder interconnect 44 electrically couples the conductive pillars 36 of the die 14 with the top conductor pads 28 of the electronic packaging substrate 12.

Figure 1C:
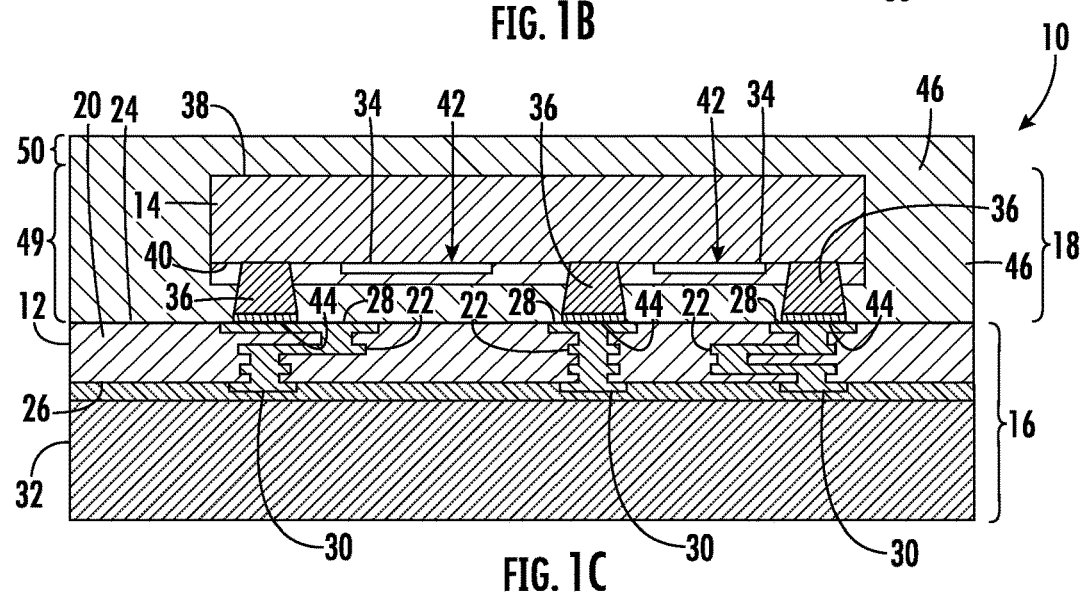
FIG. 1C is a side view of assembly of the electronic device of FIG. 1A, illustrating forming an encapsulant over the die.

FIG. 1C is a side view of assembly of the electronic device of FIG. 1A, illustrating forming an encapsulant 46 (may also be referred to as an overmold) over the die 14. The encapsulant 46 (e.g., EMC (Epoxy Mold Compound)) is of a first material and extends over die 14, including over the top side 24, over the bottom side 26, and around the conductive pillars 36. The encapsulant 46 includes a main portion 49 and a top portion 50. In particular, the die 14 has a first initial thickness t1 and a top portion 50 of the encapsulant 46 includes a second initial thickness t2. In certain embodiments, the encapsulant 46 includes an epoxy mold compound. In certain embodiments, the encapsulant (e.g., EMC) is a highly formulated material that contains epoxy resins, curing agents, accelerators, fillers, flame retardants, adhesion promoters, release materials (allows release from the mold cavity wall after molding), pigments (e.g., like carbon black), and/or other proprietary additives. In certain embodiments, silica filler is the highest item by percentage within the EMC. This silica can be replaced by another filler type (e.g., alumina) to assist with thermal release.

Figure 1D:
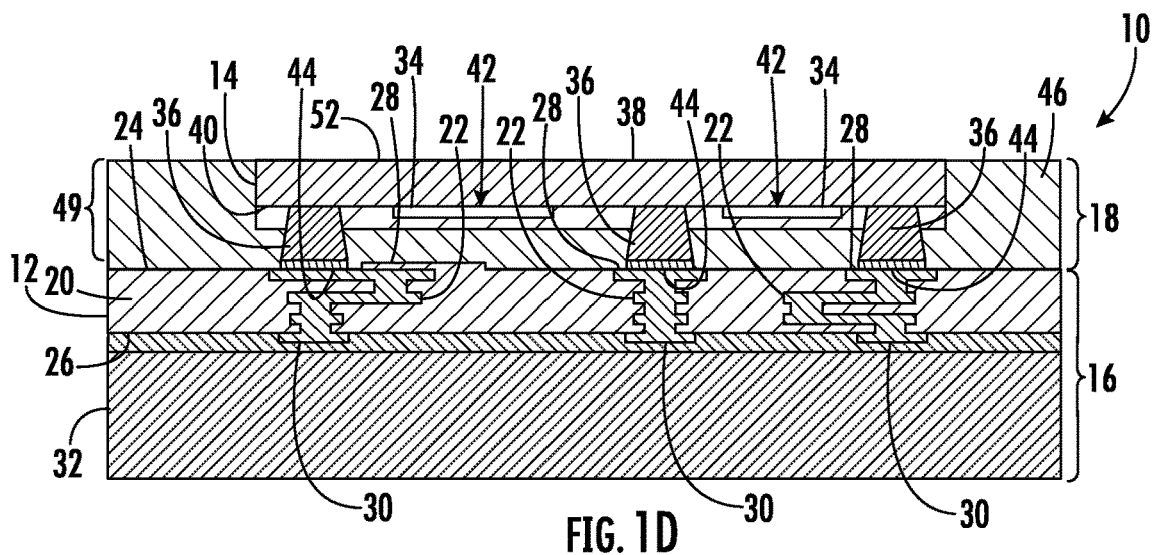
FIG. 1D is a side view of assembly of the electronic device of FIG. 1A, illustrating removal of at least a portion of the encapsulant and the die to form an exposed portion of the die.

FIG. 1D is a side view of assembly of the electronic device of FIG. 1A, illustrating removal of at least a portion of the encapsulant 46 and the die 14 to form an exposed portion 52 of the die 14. In particular, the top portion 50 of the first material of the encapsulant 46 is removed (e.g., milled, ground) to the top side 24 of the die 14. The die 14 is removed (e.g., milled, ground) as well. In certain embodiments, removal includes milling, grinding laser ablation, or other means to expose the die 14 while within the encapsulant 46. Accordingly, the die 14 has a first new thickness t1' that is less than the first initial thickness t1. The exposed portion 52 at the top side 24 of the die 14 is devoid of an encapsulant 46. In certain embodiments, removal of the encapsulant 46 and/or the die 14 includes milling and/or grinding.

Figure 1E:
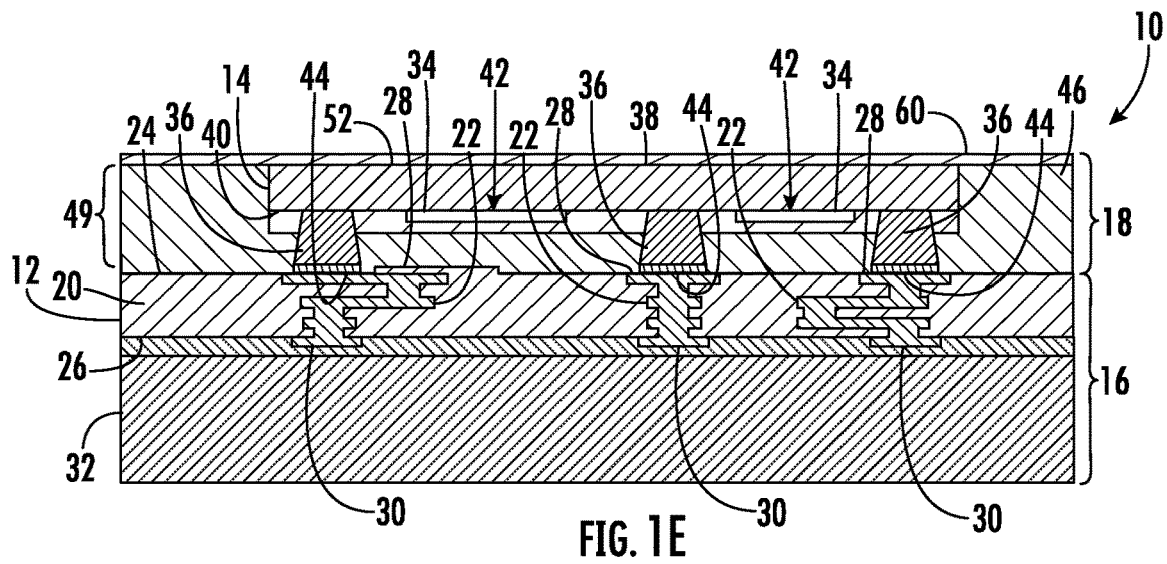
FIG. 1E is a side view of assembly of the electronic device of FIG. 1A, illustrating applying a thin dielectric film over the exposed portion of the die.

FIG. 1E is a side view of assembly of the electronic device of FIG. 1A, illustrating applying a thin dielectric film 60 over the exposed portion 52 of the die 14. In certain embodiments, the thin dielectric film 60 is within a single plane. In particular, the encapsulant 46' includes the main portion 49 and the thin dielectric film 60. The second new thickness t2' is smaller than the second initial thickness t2. In certain embodiments, the second new thickness t2' is 5-50 um thickness, such as 15-25 um thickness. The thickness t2' may depend on the thermal performance, electrical performance, and/or height requirements of the electronic device 10.

In certain embodiments, the thin dielectric film 60 is in a wafer, panel, or strip format. In certain embodiments, the thin dielectric film 60 is a film or overlay film. In certain embodiments, the thin dielectric film is applied as a liquid or a film (e.g., wafer backside protection coatings). For example, the thin dielectric film 60 can be applied as a laminate or applied as a liquid. In certain embodiments, the thin dielectric film 60 includes thermally conductive fillers, such as for laterally spreading heat in steady-state and transient conditions.

Figure 1F:
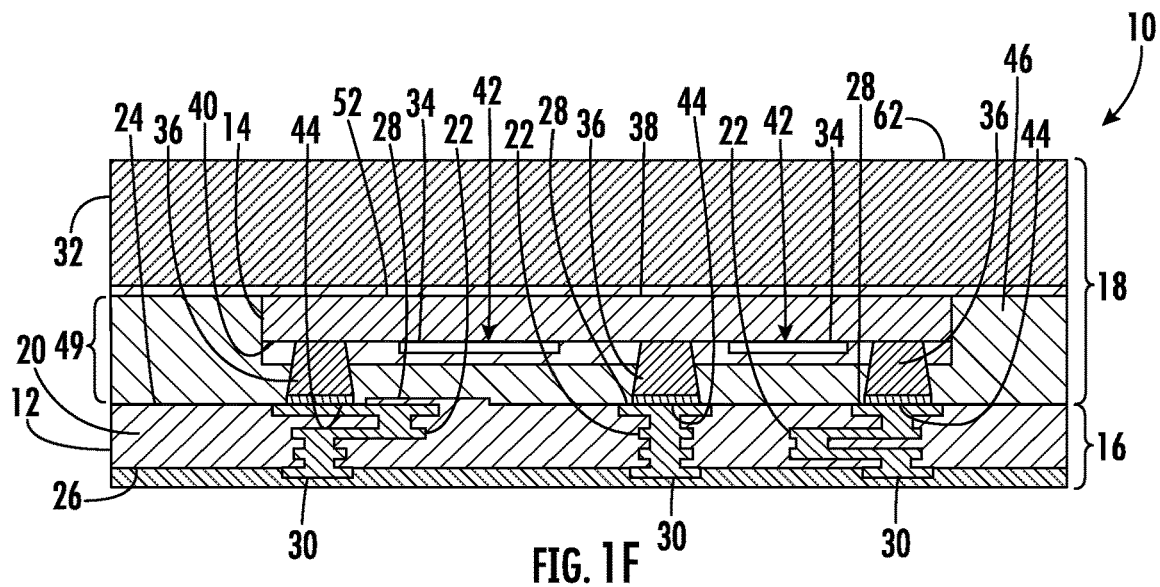
FIG. 1F is a side view of assembly of the electronic device of FIG. 1A, illustrating applying a die carrier to the thin dielectric film.

FIG. 1F is a side view of assembly of the electronic device 10 of FIG. 1A illustrating applying a die carrier 62 to the thin dielectric film 60. In particular, the die carrier 62 is bonded to the thin dielectric film 60 using metal to metal bonds, solders (e.g., AuSn), conductive adhesives, sintered materials, DBII bonding techniques, and/or hybrid bonding techniques, etc. The substrate carrier 32 is debonded and removed from the electronic packaging substrate 12. The electronic device 10 is then flipped onto the die carrier 62.

Figure 1G:
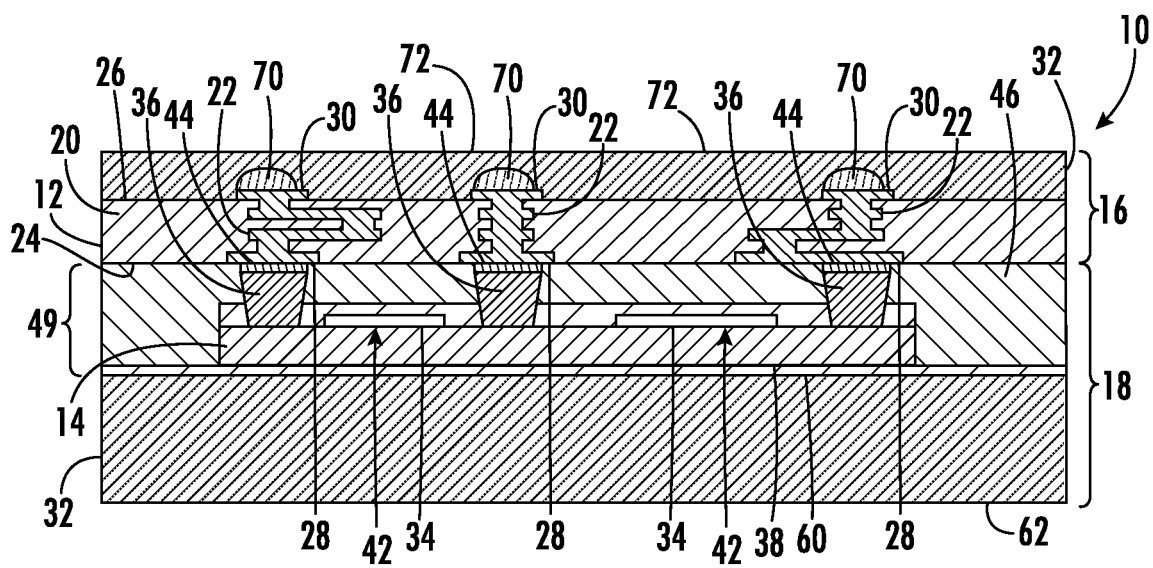
FIG. 1G is a side view of assembly of the electronic device of FIG. 1A, illustrating applying solder interconnect and tape to the electronic packaging substrate.

FIG. 1G is a side view of assembly of the electronic device of FIG. 1A, illustrating applying solder interconnects 70 and tape 72 to the electronic packaging substrate 12. In particular, solder interconnects 70 are applied to each bottom conductor pad 30 of the electronic packaging substrate 12. A tape 72 is then applied over the bottom side 26 of the electronic packaging substrate 12, including the solder interconnects 70 and bottom conductor pads 30. The die carrier 62 is then debonded and removed from the thin dielectric film 60. The electronic device 10 is then flipped. In certain embodiments, a substrate carrier is then applied to the tape 72.

Figure 1H:
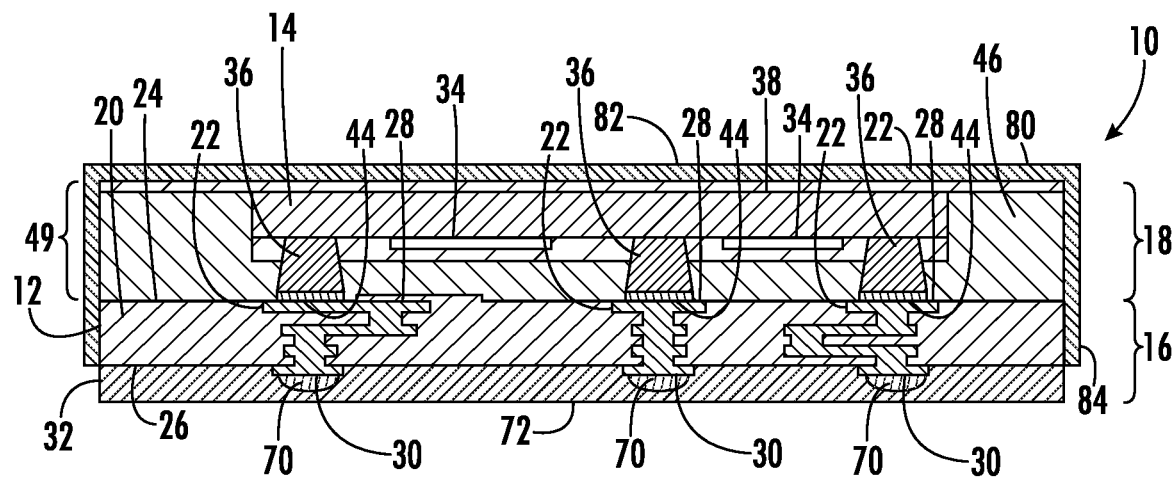
FIG. 1H is a side view of assembly of the electronic device of FIG. 1A illustrating debonding the die carrier and applying a shield over the encapsulant and the die.

FIG. 1H is a side view of assembly of the electronic device of FIG. 1A illustrating debonding the die carrier 62 and applying a shield 80 over the encapsulant 46 and the die 14. The shield 80 includes a top wall 82 and a sidewall 84 extending around a perimeter of the top wall 82. In certain embodiments, the sidewall 84 extends along a perimeter of the encapsulant 46' (including the thin dielectric film 60 and the main portion 49). In certain embodiments, the shield 80 includes silicon, Silicone carbide (SiC), diamond, Aluminum nitride (AlN), glass, etc.).

In certain embodiments, the shield 80 provides thermal spreading and heat transfer from electronic components (e.g., active components such as diodes and transistors and/or passive components, such as RF transmission lines, tuning networks, interconnecting inductors, capacitors, inductors, etc.) on the die 14 through the top side 24 of the die 14, through the thin dielectric film 60, and through the shield 80.

The electronic device 10 includes an encapsulant 46 surrounding the die 14. The encapsulant 10 includes a first dielectric material of the main portion 49 at a periphery of the electronic component 34 at a thickness t1'. The encapsulant 46 further includes a second dielectric material of the thin dielectric film 60 at a top of the electronic component 34 at a second thickness t2' less than the first thickness t1'. In certain embodiments, the second dielectric material is more thermally conductive than the first dielectric material. The thin dielectric film 60 electrically isolates the electronic component 34 from the shield 80.

Accordingly, the height of the electronic device 10 is reduced by removing (e.g., milling, grounding, etc.) the die 14 and/or encapsulant 46. The thin dielectric film 60 reduces signal loss (e.g., RF signal loss) while avoiding interference with performance (e.g., signal performance) of the electronic component 34 (e.g., BAW device).

It is noted that the die 14 and/or the encapsulant 46 has to be a certain minimum thickness to allow the material to flow. Accordingly, the die 14 and/or encapsulant 46 cannot simply be made thinner. Removing a portion of the die 14 and/or encapsulant 46 allows use of the same manufacturing technique to achieve a thinner electronic device 10.

In certain embodiments, the electronic device 10 provides compartmental shielding in a complex RF SiP (System in Package) by producing a thin submodule that is self-shielded. In certain embodiments, the electronic device 10 provides a heterogenous RDL-first packaging technique that integrates multiple RF die/components into a shielded submodule for assembly into a more complex SiP.

In certain embodiments, the electronic device 10 can form a module (e.g., RF module) in which the electronic packaging substrate 12 is packaged using any suitable type of integrated circuit (IC) packaging. For example, IC packaging may include fan-out wafer-level packaging (FOWLP), fan-out panel-level packaging (FOPLP), fan-in wafer-level packaging (FIWLP), fan-in panel-level packaging (FIPLP), or wafer-level chip-scale packaging (WLCSP) facilitates a high-density package for ICs, including monolithic microwave integrated circuits (MMICs). FOWLP and FOPLP are packaging technologies that allow the use of semiconductor-like thin-film processes (e.g., high-resolution lithographic patterning, physical vapor deposition (PVD) metallizations, and chemical vapor deposition (CVD) dielectrics) to spread out (e.g., fan-out) dense input/output (I/O) connections on the MMIC substrate. In some examples, the electronic packaging substrate 12 can include multiple substrates and/or other circuit components to form a multi-chip module (MCM) or multi-chip package (MCP), or System in package (SiP). In such examples, a common RDL may make connections between the package substrates and/or other circuit components.

For example, in one embodiment of the FOWLP process, known-good die (KGD) (e.g., the die and a plurality of additional IC dies) and sometimes other passive components are precisely placed onto a temporary carrier, often called reconstructed wafer, and epoxy over-molded to form the overmold layer. The KGD can be formed from one or more wafers, which are diced to form the die 14 and a plurality of additional dies 14, then overmolded into an overmolded array. A portion of the overlay mold can be removed to expose a top and/or bottom surface of the IC die 14 such that the overlay mold partially surrounds the IC die 14 (e.g., surrounding only sides of the IC die 14 or sides and one of the top or bottom of the IC die 14).

Figure 2A:
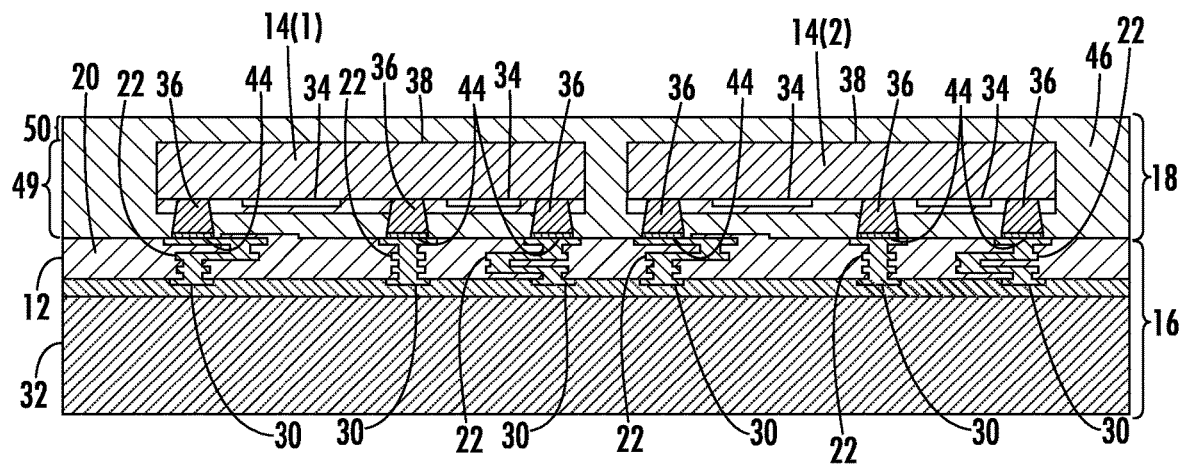
FIG. 2A is a side view of assembly of an electronic device with multiple dies within an encapsulant.
Figure 2B:
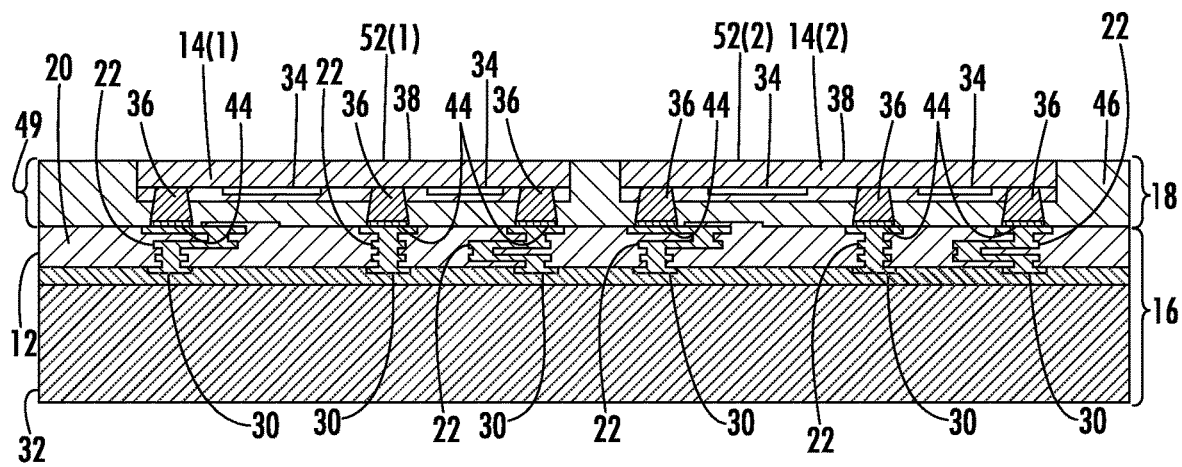
FIG. 2B is a side view of assembly of the electronic device of FIG. 2A illustrating removal of at least a portion of the encapsulant and each of the multiple dies to form exposed portions of the multiple dies.
Figure 2C:
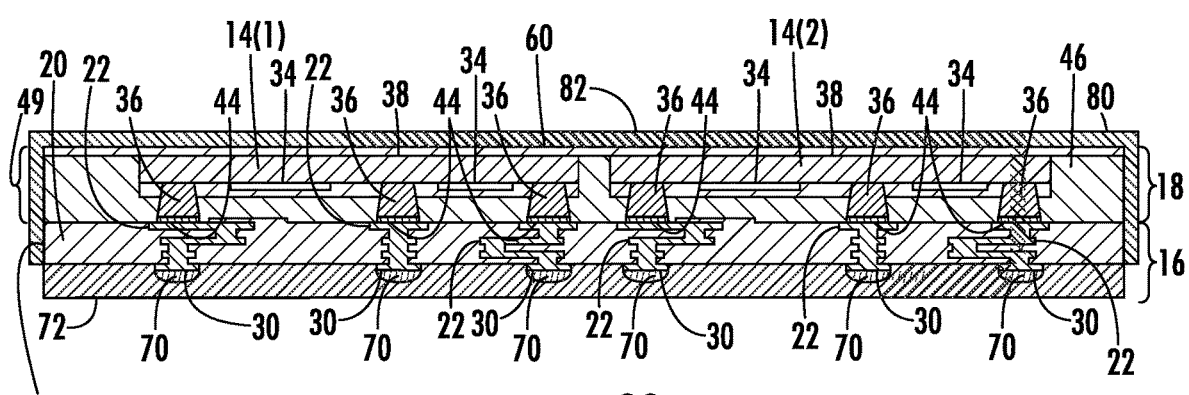
FIG. 2C is a side view of assembly of the electronic device of FIG. 2A, illustrating applying a thin dielectric film and a shield over the exposed portions of the multiple dies.

FIGS. 2A-2C are views illustrating an electronic device 10' with multiple dies 14(1)-14(2) thereon. Each of the first die 14(1) and the second die 14(2) includes an electronic component 34, and solder interconnects 70 electrically coupling the electronic component 34 to the electronic packaging substrate 12.

FIG. 2A is a side view of assembly of an electronic device 10' with multiple dies 14(1)-14(2) within an encapsulant 46. In particular, the electronic packaging substrate 12 and dies 14(1)-14(2) are mounted to the electronic packaging substrate 12 via solder interconnects 70 between the dies 14(1)-14(2) and the substrate 12. The encapsulant 46 is formed over the dies 14(1)-14(2).

FIG. 2B is a side view of assembly of the electronic device of FIG. 2A illustrating grinding of at least a portion of the encapsulant 46, and each of the multiple dies 14(1)-14(2) to form exposed portions 52(1)-52(2) of the multiple dies 14(1)-14(2). In other words, the first die 14(1) and the second die 14(2) are removed (e.g., milling, grinding) to a same height relative to the electronic packaging substrate 12. Further, the encapsulant 46 is removed (e.g., milling, grinding) to a same height as the dies 14(1)-14(2).

FIG. 2C is a side view of assembly of the electronic device of FIG. 2A, illustrating applying a thin dielectric film 60 and a shield 80 over the exposed portions 52(1)-52(2) of the multiple dies 14(1)-14(2). The thin dielectric film 60 extends over the first die 14(1) and the second die 14(2). Further, the shield 80 covers the first die 14(1) and the second die 14(2).

Figure 3:
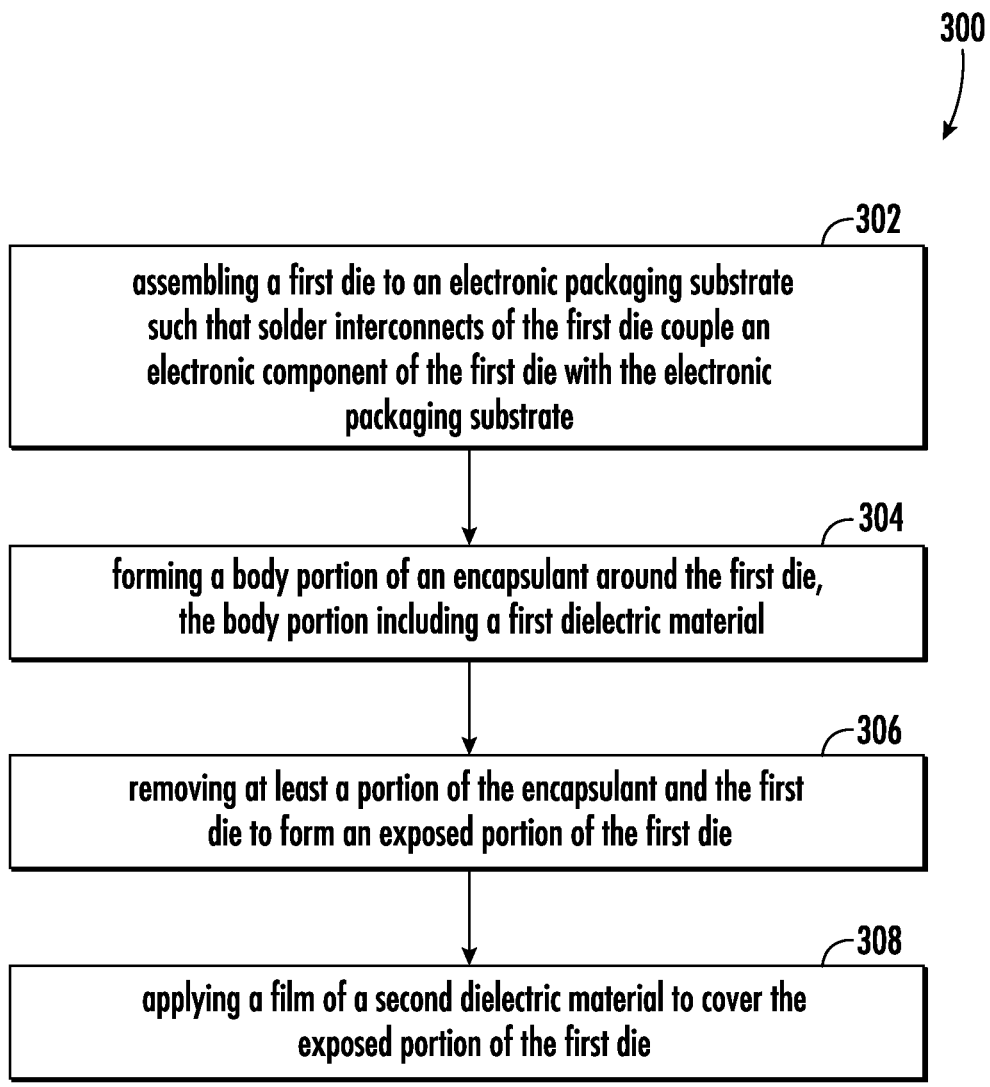
FIG. 3 is a flowchart identifying steps of a method for manufacturing an electronic device.

FIG. 3 is a flowchart 300 identifying steps of a method for manufacturing an electronic device 10, 10'. Step 302 includes assembling a first die 14, 14(1) to an electronic packaging substrate 12 such that solder interconnects 70 of the first die 14, 14(1) couple an electronic component 34 of the first die 14, 14(1) with the electronic packaging substrate 12. Step 304 includes forming a body portion 20 of an encapsulant 46 around the first die 14, 14(1). The body portion 20 includes a first dielectric material. Step 306 includes removing at least a portion of the encapsulant 46 and the first die 14, 14(1) to form an exposed portion 52 of the first die. Step 308 includes applying a thin dielectric film 60 of a second dielectric material to cover the exposed portion 52, 52(1) of the first die 14, 14(1).

In certain embodiments, the method further includes applying a shield 80 to cover the encapsulant 46'.

In certain embodiments, the first die 14, 14(1) includes a BAW filter die, and the electronic component 34 includes a BAW filter.

In certain embodiments, the second dielectric material of the thin dielectric film 60 is more thermally conductive than the first dielectric material of the body portion 20.

In certain embodiments, the method further includes applying the thin dielectric film 60 of the second dielectric material to integrally extend over the first die 14(1) and a second die 14(2).

In certain embodiments, the method further includes removing a second die 14(2) to form an exposed portion 52(2) of the second die 14(2).

Figure 4:
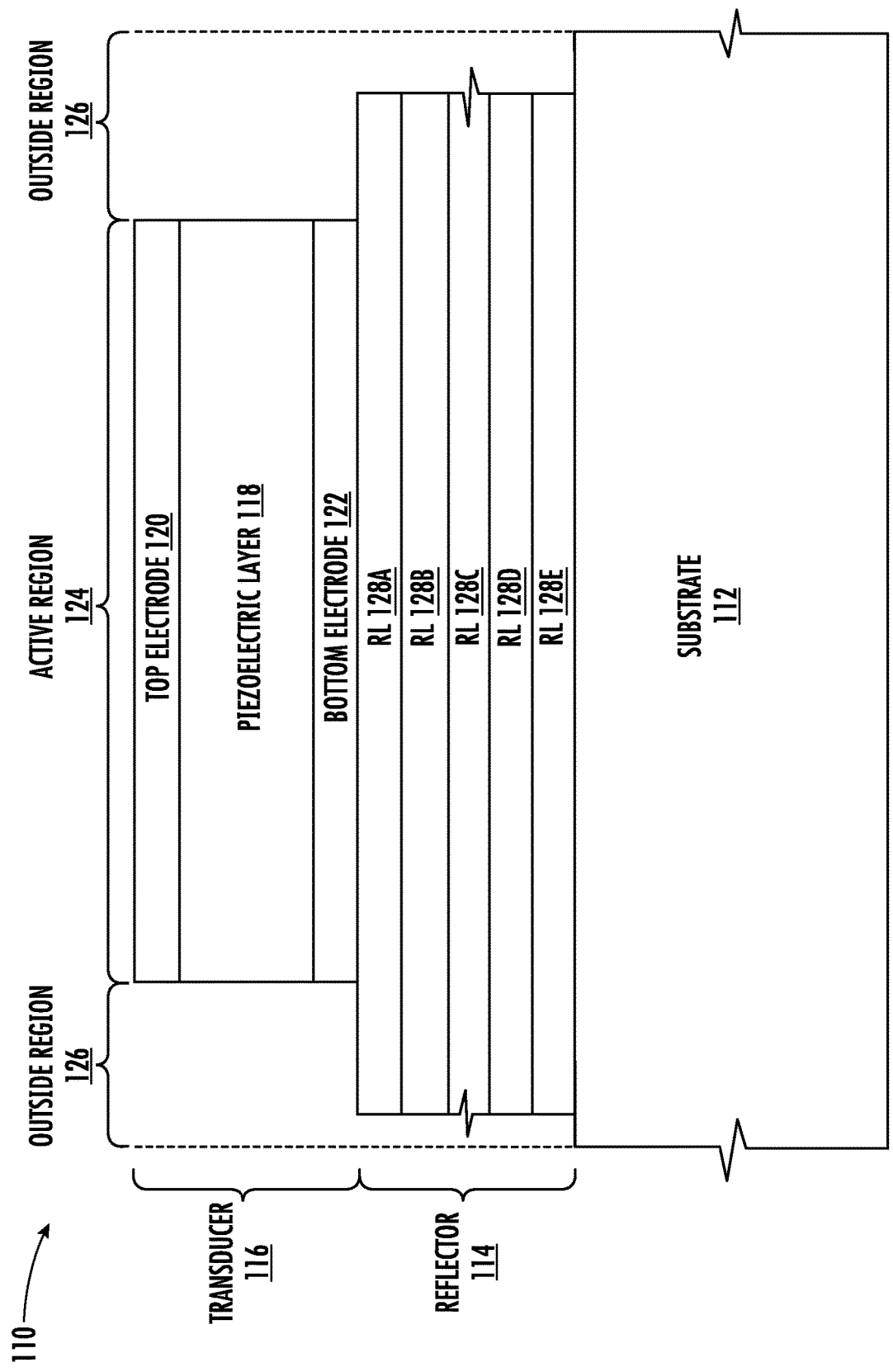
FIG. 4 illustrates a conventional Bulk Acoustic Wave (BAW) resonator.

FIG. 4 illustrates a conventional Bulk Acoustic Wave (BAW) resonator. BAW resonators are used in many high-frequency filter applications. In certain embodiments, the BAW resonator 110 is a solidly mounted resonator (SMR) type BAW resonator 110 and generally includes a substrate 112, a reflector 114 mounted over the substrate 112, and a transducer 116 mounted over the reflector 114. The transducer 116 rests on the reflector 114 and includes a piezoelectric layer 118, which is sandwiched between a top electrode 120 and a bottom electrode 122. The top and bottom electrodes 120, 122 may be formed of Tungsten (W), Molybdenum (Mo), Platinum (Pt), or like material, and the piezoelectric layer 118 may be formed of Aluminum Nitride (AlN), Zinc Oxide (ZnO) or other appropriate piezoelectric material. Although shown in FIG. 4 as including a single layer, the piezoelectric layer 118, the top electrode 120, and/or the bottom electrode 122 may include multiple layers of the same material, multiple layers in which at least two layers are different materials, or multiple layers in which each layer is a different material.

The BAW resonator 110 is divided into an active region 124 and an outside region 126. The active region 124 generally corresponds to the section of the BAW resonator 110, where the top and bottom electrodes 120, 122 overlap and also include the layers below the overlapping top and bottom electrodes 120, 122. The outside region 126 corresponds to the section of the BAW resonator 110 that surrounds the active region 124.

For the BAW resonator 110, applying electrical signals across the top electrode 120 and the bottom electrode 122 excites acoustic waves in the piezoelectric layer 118. These acoustic waves primarily propagate vertically. A primary goal in BAW resonator design is to confine these vertically-propagating acoustic waves in the transducer 116. Acoustic waves traveling upwardly are reflected back into the transducer 116 by the air-metal boundary at the top surface of the top electrode 120. Acoustic waves traveling downward are reflected back into the transducer 116 by the reflector 114 or by an air cavity, which is provided just below the transducer in a Film BAW Resonator (FBAR).

The reflector 114 is typically formed by a stack of reflector layers (RL) 128A through 128E (referred to generally as reflector layers 128), which alternate in material composition to produce a significant reflection coefficient at the junction of adjacent reflector layers 128. Typically, the reflector layers 128A through 128E alternate between materials having high and low acoustic impedances, such as tungsten (W) and silicon dioxide (SiO$_2$). While only five reflector layers 128A through 128E are illustrated in FIG. 4, the number of reflector layers 128 and the structure of the reflector 114 will vary from one design to another.

Those skilled in the art will recognize improvements and modifications to the preferred embodiments of the present disclosure. All such improvements and modifications are considered within the scope of the concepts disclosed herein and the claims that follow.

What is claimed is:

1. An electronic device, comprising:
   an electronic packaging substrate with conductor trace;
   a first die comprising:

an electronic component; and
a solder interconnect electrically coupling the electronic component to the electronic packaging substrate; and
an encapsulant surrounding the first die and comprising:
a first dielectric material at a periphery of the electronic component and below the electronic component and adjacent to the solder interconnect, the first dielectric material being located at the periphery of the electronic component and having a first thickness;
a second dielectric material at a top of the first die, the second dielectric material having a second thickness less than the first thickness; and
a shield covering the encapsulant, the shield including a top wall positioned on the second dielectric material and a side wall that extends along a perimeter of the encapsulant and is attached to the encapsulant.

2. The electronic device of claim 1, wherein the electronic packaging substrate comprises a redistribution layer.

3. The electronic device of claim 1, wherein the electronic packaging substrate comprises a laminate.

4. The electronic device of claim 1, wherein:
the first die comprises a Bulk Acoustic Wave, BAW, filter die; and
the electronic component comprises a BAW filter.

5. The electronic device of claim 1, wherein the first die includes at least one of silicon, Gallium Arsenide, or Gallium Nitride.

6. The electronic device of claim 5, wherein a Bulk Acoustic Wave, BAW, filter die includes an air cavity structure.

7. The electronic device of claim 5, wherein the first die is devoid of an air cavity structure.

8. The electronic device of claim 1, wherein the electronic component further comprises conductive pillars, the solder interconnect at an end of the conductive pillars; and
the first dielectric material of an overmold is between the conductive pillars.

9. The electronic device of claim 1, wherein the encapsulant comprises an epoxy mold compound.

10. The electronic device of claim 1, wherein the second dielectric material is more thermally conductive than the first dielectric material.

11. The electronic device of claim 1, wherein the encapsulant comprises:
an overmold comprising the first dielectric material; and
a thin film comprising the second dielectric material.

12. The electronic device of claim 11, wherein the thin film is within a single plane.

13. The electronic device of claim 1, further comprising:
a second die comprising:
an electronic component; and
a solder interconnect electrically coupling the electronic component to the electronic packaging substrate;
wherein the second dielectric material integrally extends over the first die and the second die; and
wherein the shield covers the first die and the second die.

14. The electronic device of claim 1, wherein the first die and the second die are ground to a same height relative to the electronic packaging substrate.

15. A method of manufacturing an electronic device, comprising:
assembling a first die to an electronic packaging substrate such that solder interconnects of the first die couple an electronic component of the first die with the electronic packaging substrate;
forming a body portion of an encapsulant around the first die and below the electronic component between the solder interconnects, the body portion comprising a first dielectric material;
removing at least a portion of the encapsulant and the first die to form an exposed portion of the first die;
forming a second dielectric material to cover the exposed portion of the first die; and
applying a shield to cover the encapsulant, the shield including a top wall positioned on the second dielectric material and a side wall that extends along a perimeter of the encapsulant and is attached to the encapsulant.

16. The method of claim 15, wherein:
the first die comprises a Bulk Acoustic Wave, BAW, filter die; and
the electronic component comprises a BAW filter.

17. The method of claim 15, wherein the second dielectric material of a film is more thermally conductive than the first dielectric material of the body portion.

18. The method of claim 15, further comprising:
forming the second dielectric material to integrally extend over the first die and a second die.

19. The method of claim 15, further comprising grinding down a second die to form an exposed portion of the second die.

* * * * *